(12) United States Patent
Pavelchek

(10) Patent No.: US 7,018,717 B2
(45) Date of Patent: Mar. 28, 2006

(54) ANTIREFLECTIVE HARD MASK COMPOSITIONS

(75) Inventor: Edward K. Pavelchek, Stow, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/457,258

(22) Filed: Jun. 9, 2003

(65) Prior Publication Data
US 2003/0209515 A1   Nov. 13, 2003

Related U.S. Application Data

(63) Continuation of application No. 09/330,417, filed on Jun. 11, 1999, now Pat. No. 6,890,448.

(51) Int. Cl.
*B32B 25/20*   (2006.01)

(52) U.S. Cl. ..................... 428/447; 428/446

(58) Field of Classification Search ............... 428/446, 428/447
See application file for complete search history.

(56) References Cited

U.S. PATENT DOCUMENTS

| | | | |
|---|---|---|---|
| 5,100,503 A | 3/1992 | Allman et al. | |
| 5,234,990 A | 8/1993 | Flaim et al. | |
| 5,346,586 A | 9/1994 | Keller | |
| 5,380,621 A | 1/1995 | Dichiara et al. | |
| 5,380,889 A | 1/1995 | Hanawa et al. | |
| 5,468,342 A | 11/1995 | Nulty et al. | |
| 5,545,588 A | 8/1996 | Yoo | |
| 5,744,227 A | 4/1998 | Bright et al. | |
| 5,747,388 A | 5/1998 | Kusters et al. | |
| 5,747,622 A | 5/1998 | Maeda et al. | |
| 5,750,316 A | 5/1998 | Kawamura et al. | |
| 5,750,442 A | 5/1998 | Juengling | |
| 5,753,417 A | 5/1998 | Ulrich | |
| 5,821,169 A | 10/1998 | Nguyen et al. | |
| 5,851,730 A | 12/1998 | Thackeray et al. | |
| 5,851,738 A | 12/1998 | Thackeray et al. | |
| 5,853,471 A * | 12/1998 | Yoshida et al. ........ 106/287.13 | |
| 5,886,102 A | 3/1999 | Sinta et al. | |
| 5,935,760 A | 8/1999 | Shao et al. | |
| 5,939,236 A | 8/1999 | Pavelchek et al. | |
| 5,939,511 A | 8/1999 | Zampini et al. | |
| 6,261,743 B1 | 7/2001 | Pavelchek et al. | |
| 6,268,457 B1 * | 7/2001 | Kennedy et al. ............... 528/39 | |
| 6,316,165 B1 | 11/2001 | Pavelchek et al. | |
| 6,329,118 B1 | 12/2001 | Hussein et al. | |
| 6,368,400 B1 | 4/2002 | Baldwin et al. | |
| 6,368,768 B1 | 4/2002 | Jung et al. | |

(Continued)

FOREIGN PATENT DOCUMENTS

EP   0 494 744 A1   7/1992

(Continued)

OTHER PUBLICATIONS

A. Grill. Plasma in Materials Fabrication. 1994, IEEE Press Mark, p. 224, 5th paragraph.

*Primary Examiner*—Kuo-Liang Peng
(74) *Attorney, Agent, or Firm*—Peter F. Corless; Edwards Angell Palmer & Dodge LLP

(57) ABSTRACT

New organic-based radiation absorbing compositions are provided that are suitable for use as an antireflective coating composition ("ARC") for an overcoated photoresist. These compositions also serve effectively as a hard mask layer by exhibiting a sufficient plasma etch selectively from an undercoated dielectric layer.

10 Claims, 1 Drawing Sheet

U.S. PATENT DOCUMENTS

| | | |
|---|---|---|
| 6,410,209 B1 | 6/2002 | Adams et al. |
| 6,451,503 B1 | 9/2002 | Thackeray et al. |
| 6,472,128 B1 | 10/2002 | Thackeray et al. |
| 6,890,448 B1 | 5/2005 | Pavelchek |
| 2002/0031729 A1 | 3/2002 | Trefonas et al. |
| 2002/0055000 A1 | 5/2002 | Kennedy et al. |

FOREIGN PATENT DOCUMENTS

| | | |
|---|---|---|
| EP | 0 803 776 A2 | 10/1997 |
| EP | 0 823 661 A1 | 2/1998 |
| JP | 06-244286 | 9/1994 |
| WO | WO 00/77575 A1 | 12/2000 |

* cited by examiner

ANTIREFLECTIVE HARD MASK COMPOSITIONS

The present application is a continuation of U.S. patent application Ser. No. 09/330,417 filed Jun. 11, 1999, now issued as U.S. Pat. No. 6,890,448.

BACKGROUND OF THE INVENTION

1. Field of the Invention

The present invention relates to compositions and methods for manufacture of integrated circuit systems. More particularly, organic spin-on type antireflective coating (ARC) compositions are provided that can exhibit good resistance to oxygen-based plasma etches and serve as hard masks in circuit manufacturing processes.

2. Background

In the manufacture of semiconductor devices, a variety of conductive device regions and layers are formed on the device substrate, generally segregated by electrically insulating dielectric regions. Those dielectric regions may be formed e.g. from silicon dioxide and produced by various techniques, e.g. oxide growth, sputtering or other chemical deposition procedures. In the manufacture of the device, it is necessary to make openings in the dielectric layers to permit contact and electrical communication between different regions of the device.

Photolithography is employed to form such apertures in dielectric layers. A photoresist is patterned over the dielectric layer and the dielectric regions bared upon exposure are removed by a dry etch, typically a plasma etch or ion bombardment. See generally U.S. Pat. Nos. 5,468,342 and 5,346,586.

However, resist mask also may degrade during the plasma etch of the underlying dielectric material, reducing resolution of the image patterned into the dielectric layer. Such imperfect image transfer can only compromise performance of the semiconductor device.

Certain inorganic materials known as hard masks have been interposed between dielectric and resist layers to reduce imperfections in image transfer from the resist layer to the underlying dielectric layer. The hard mask material, e.g. polysilicon, silicon nitride, aluminum, titanium silicide, or tungsten, is vapor deposited such as by sputtering onto the dielectric layer. A photoresist is then coated and imaged over the hard mask. The inorganic hard mask regions bared upon resist development are removed by a plasma etch to which the organic resist layer is resistant. Relatively high etch selectivity can be achieved between the inorganic hard mask layer and the overcoated patterned organic-based resist. Such etch selectivity is generally not possible between a dielectric layer and an organic-based resist. Upon such etching, the hard mask profile matches the resist mask. Dielectric regions exposed upon hard mask etching now can be removed by an etch that is selective for the dielectric and for which the hard mask is resistant. Because high etch selectively can be realized between the dielectric layer material and the hard mask, image transfer imperfections as discussed above can be avoided. See generally the above cited U.S. patents.

While such an approach can be effective for the manufacture of many integrated circuits, industry demands continue produce even smaller features at higher resolution.

Indeed, other problems in circuit manufacture that can limit resolution and the ability to form ever smaller features. For instance, reflection of activating radiation used to expose a photoresist can limit resolution of the image patterned in the resist. In particular, reflection of radiation from the underlying surface/photoresist interface can produce spatial variations in the radiation intensity in the photoresist, resulting in non-uniform photoresist linewidth upon development. Exposure radiation also can scatter from the underlying surface/photoresist interface into regions of the photoresist coating where exposure is not intended, again resulting in linewidth variation.

It thus would be desirable to have new compositions and methods for integrated circuit manufacture.

SUMMARY OF THE INVENTION

The present invention provides new organic-based radiation absorbing compositions suitable for use as an antireflective coating composition ("ARC") for an overcoated photoresist.

The antireflective compositions of the invention also can serve effectively as a hard mask layer by exhibiting a sufficient plasma etch selectively to an undercoated dielectric layer (e.g. an inorganic oxide or an organic layer) and an overcoated photoresist. The antireflective hard mask compositions of the invention contain a component that has inorganic substitution that can provide etch selectivity. For instance, preferred antireflective hard mask compositions of the invention include one or more components that comprises one or more inorganic elements, typically a member of Group IIIa, IVa, Va, VIa, VIIa, VIII, Ib, IIb, IIIb, IVb and/or Vb of the Periodic Table, more preferably silicon, geranium, aluminum, particularly. For example, an antireflective hard mask composition of the invention can contain an organosilicon polymer, e.g. a copolymer provided by reaction of acrylate monomers that have Si substitution.

Antireflective hard mask compositions of the invention also preferably contain a chromophore component that can effectively absorb exposure radiation used to pattern an overlying resist layer. The chromophore can vary with the exposure wavelength employed for the overcoated photoresist. For instance, for a resist imaged at 248 nm, the antireflective hard mask composition may suitably contain a resin or other component that has anthracene or naphthyl groups. For a resist imaged at 193 nm, the antireflective hard mask composition may suitably contain a resin or other component that has phenyl groups. A single resin also may contain the radiation absorbing chromophore and inorganic groups that can provide etch selectivity. The antireflective hard compositions preferably are cured and crosslinked during processing.

The invention also includes methods for patterning and treating a substrate, particularly an electronic packaging device such as a semiconductor wafer and the like.

More particularly, a preferred method of the invention includes providing a substrate (e.g. a semiconductor wafer) having a dielectric surface layer and applying a coating layer of an antireflective hard mask composition of the invention thereon. The organic antireflective hard mask composition can be applied by spin-coating, clearly more convenient than the typical vapor deposition employed for application of current inorganic hard mask layers.

A photoresist layer is then applied over the antireflective hard mask layer and the resist layer is imaged to patterned radiation and developed to provide a relief image over the antireflective layer. The antireflective hard mask is then etched with a plasma that is more reactive with the antireflective layer than the overcoated resist relief image, e.g. an etch selectively of antireflective hard mask layer:photoresist relief image of at least about 3:1, more preferably at least about 5:1, still more preferably at least about 7:1 or 10:1. For instance, an antireflective hard mask layer that contains a silicon inorganic component can be selectively etched with a fluorine-based plasma. An antireflective hard mask layer that contains an Al inorganic component can be selectively etched with a clorine-based plasma.

That etch treatment provides a relief image of the antireflective hard mask composition that corresponds to that of the overlaying patterned resist. The bared dielectric layer areas are then etched with a plasma that is comparatively less reactive with the antireflective hard mask layer, e.g. an etch selectively of underlying dielectric layer:antireflective hard mask layer of at least about 3:1, more preferably at least about 5:1, still more about at least about 7:1 or 10:1. For instance, an Si-based dielectric layer such as a silicon nitride or silicon oxide layer could be selectively etched with a suitable halide plasma, and an organic dielectric layer could be selectively etched with an oxygen-based plasma. Substrate areas bared upon such etching of the dielectric layer then can be selectively processed as desired, e.g. metallized.

To more specifically illustrate systems of the invention, an antireflective hard mask material that comprises Si can be etched with a halide plasma such as a fluorine or chlorine plasma, and an underlying organic dielectric layer can be selectively etched with an oxygen-based plasma. In another system, an antireflective hard mask material that comprises Al can be etched with a chlorine-based plasma, and an underlying $SiO_2$ dielectric layer can be selectively etched with a fluorine-based plasma.

The invention further provides novel articles of manufacture comprising substrates such as a microelectronic wafer coated with an antireflective hard mask composition of the invention alone or in combination with an overcoated photoresist composition and/or an underlying dielectric layer. Other aspects of the invention are disclosed infra.

DETAILED DESCRIPTION OF THE INVENTION

Figure 1:
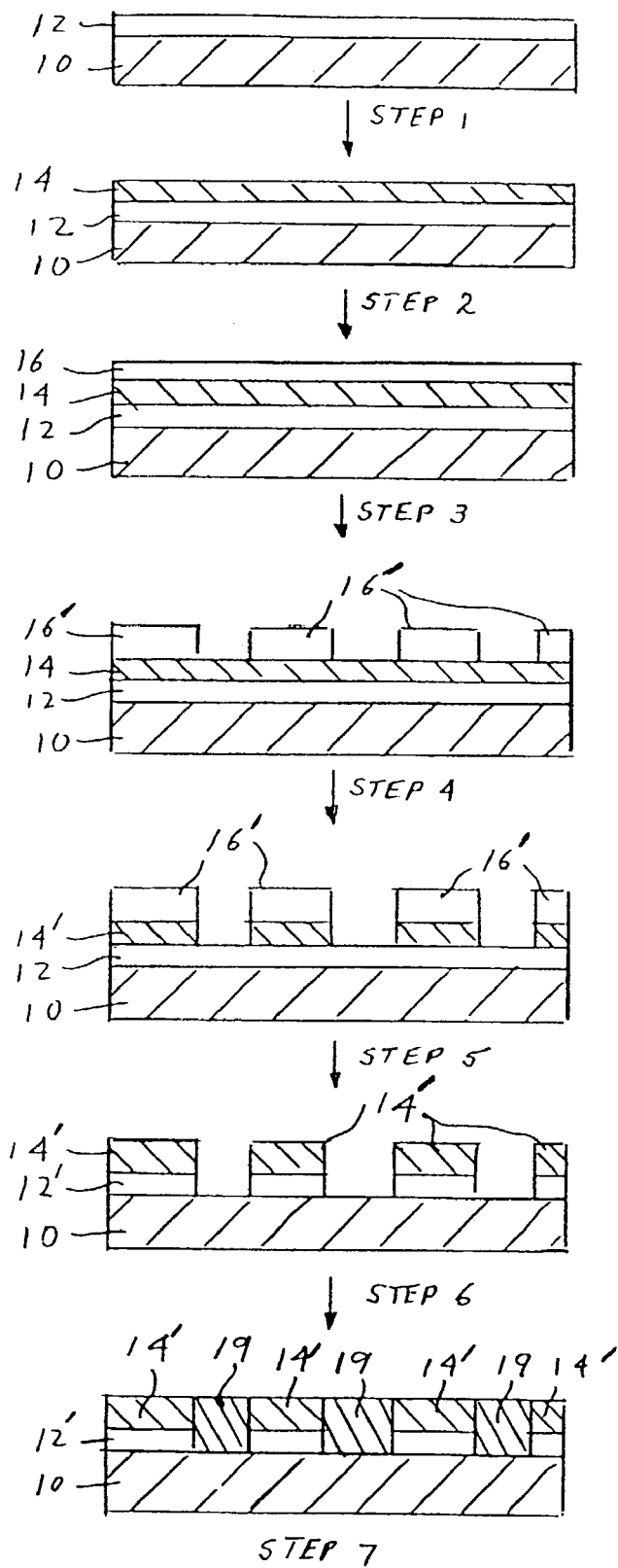
FIG. 1 depicts schematically a preferred method of the invention.

As discussed above, the invention provides novel antireflective hard mask compositions that can be applied as spin-on formulations. The compositions of the invention can exhibit good etch selectivity relative to an underlying dielectric layer, such as an inorganic material e.g. $SiO_2$ or other inorganic oxide, or an organic resin layer.

The antireflective hard mask compositions are mixtures of carbon groups and inorganic elements such as Si, As and/or Ge. References herein to inorganic atoms or elements are intended to refer to those non-carbon, multivalent elements other than hydrogen, nitrogen, oxygen or sulfur, preferably a member of Group IIb, IIIB, IVB, VB or VIB of the Periodic Table, more preferably a member of Group IIIB or IVB of the Periodic Table.

An antireflective hard mask composition typically will contain at least 1 mole percent of inorganic elements, based on total solids (all components except solvent carrier) of the composition, more typcially at least about 3 or 5 mole percent of inorganic elements, based on total solids (all components except solvent carrier) of the composition. More preferably, the antireflective hard mask composition will contain at least about 7, 10, 12 or 15 mole percent of inorganic elements based on total solids of the composition. Higher levels of inorganic content also will be suitable, e.g. where the antireflective hard mask composition contains at least about 17, 20, 25, 30, 35 or 40 mole percent of inorganic elements, based on total solids of the composition. The antireflective hard mask composition typically has a substantial carbon content, e.g. at least about 10, 15 or 20 mole percent of the composition based on total solids will be carbon. More preferably, at least about 25, 30, 35, 40, 50 or 60 mole percent of the composition based on total solids will be carbon. The one or more chromophores for absorbing exposure radiation of an overcoated photoresist typically will be aromatic carbon groups, as generally discussed above.

Referring now to the FIG. 1 of the drawings, where a particularly preferred method of the invention is generally depicted, in Step 1 a substrate 10 is provided having an overcoated dielectric layer 12. Substrate 10 may be e.g. an electronic packaging device such as a semiconductor wafer, microchip module and the like. For example, substrate 10 may be a silicon, silicon dioxide, aluminum or aluminum oxide microelectronic wafer. Other substrates that may be employed include gallium arsenide, gallium nitride, indium-based, ceramic, quartz or copper substrates.

Layer 12 may be an inorganic oxide e.g. $SiO_2$, resin layer such as parylene or a fluorinated amphorous carbon, or any of a variety of materials employed to segregate and electrically insulate features of the processed substrate 10.

In Step 2 of FIG. 1, a coating layer 14 of an organic antireflective hard mask composition of the invention is applied over layer 12. Coating layer 14 may be applied by spin coating a liquid coating formulation over layer 12, followed by removal of the solvent carrier such as by vacuum hotplate at about 90° C. for 60 seconds. The antireflective hard mask composition in general is applied on a substrate with a dried layer thickness of between about 0.02 and 0.5 µm, more typically a dried layer thickness of between about 0.04 and 0.20 µm.

As discussed above, the antireflective hard mask composition coating contains a component that has chromophore moieties for absorption of exposure radiation of an overcoated photoresist layer as well as inorganic groups to provide plasma etch selectivity with respect to the underlying dielectric layer 12.

Preferred antireflective hard mask compositions of the invention include those that contain a resin that has chromophore and/or inorganic groups thereon. The resin is preferably organic. For instance, a polymer may be employed that has pendant chromophore groups, such as carbocyclic aryl or heteroaromatic groups for effective absorption of exposure radiation, e.g. anthracenyl (for 248 nm), phenyl (for 193 nm), naphthylene, and the like. Preferred chromophores and resins containing same are disclosed in U.S. Pat. No. 5,851,730 and European Published Application 813114A2, both assigned to the Shipley Company.

A resin that has both chromophore and etch-resistant inorganic groups can be readily prepared by reaction of a mixture of appropriate monomers, e.g. reaction of a monomer incorporating an inorganic, etch resistant element (e.g. Si, Ge, Al and the like) together with a monomer that has a desired chromophore group. Such monomers are commercially available or can be readily synthesized. For instance, acrylate monomers that include Si groups are available from a number of commercial sources such as Gelest, Inc. (Tullytown, Pa.) and others. More particularly, exemplary monomers include methacryloxymethyltris-(trimethylsiloxy)silane, allyltris(trimethylsiloxy)silane, allyltrimethoxysilane, vinyltris(trimethylsiloxy)silane, vinyltrimethoxysilane, vinyl(3,3,3-trifluoropropyl)dimethylsilane, vinyltriphenoxysilane, vinyltriethylsilane, vionyltriacetoxysilane, and the like. Vinyl-terminated silicon polymers also are available, such as vinyl terminated or methacryloxypropyl terminated p-dimethylsiloxane, which can be incorporated into other polymers by appropriate reaction, e.g. free radical polymerization in the presence of an initiator such as 2,2'azobisisobutyrnitrile, preferably in a suitable solvent such as tetrahydrofuran and the like, typically with heating until reaction completion. See Example 1 which follows for exemplary synthesis of an antireflective hard mask polymer of the invention.

In the same manner, other inorganic materials can be incorporated into components of an antireflective hard mask composition for use in accordance with the invention. For instance, other polymerizable monomers that have one or more desired inorganic atoms can be reacted to form a resin. Such monomers are commercially available from sources such as Gelest, Inc. and others. For example, suitable monomers may include allyltriethylgermane, allyltrimethylgermane, methacryloxytriethylgermane, tetrallylgermane, vinyltriethylgermane, and the like. Suitable aluminum materials also are commercially available.

Additionally, the inorganic etch-resistant component and antireflective component can be separate, blended materials of an antireflective hard mask composition of the invention. For instance, polymers with an inorganic content can be blended with organic polymers that contain the exposure radiation-absorbing chromophores. For instance, examples of suitable inorganic, etch-resistant polymers include silsesquioxanes such as p-methylsilsesequioxane which has a high silicon content and lesser silanol content; epoxypropoxypropyl terminated p-dimethylsiloxanes; carbinol functional copolymers of methylsiloxane and dimethylsiloxane; alcohol terminated copolymers of dimethylsiloxane and ethylene oxide; and silanol terminated p-dimethylsiloxane. Inorganic crosslinkers also could be employed. For example, aluminum crosslinkers may be suitable to provide the desired inorganic content to an antireflective hard mask composition, such as aluminum s-butoxide bis(ethylacetoacetate). Exemplary organic-based polymers with chromophores that could be blended with such polymers are disclosed in Shipley's U.S. Pat. No. 5,851,730 and European Published Application 813114A2. For 193 nm resist imaging, suitable phenyl-containing polymers are disclosed in copending application Ser. No. 09/153,575, filed Sep. 15, 1998, assigned to the Shipley Company. That application discloses inter alia a preferred antireflective terpolymer consisting of polymerized groups of styrene, 2-hydroxyethylmethacrylate and methylmethacrylate at a respective mole ratio of those groups of 30:38:32.

Polymers of antireflective hard mask compositions of the invention may contain other units in addition to inorganic, etch resistant elements and chromophore units. For instance, resins of compositions of the invention may have pendant cyano groups; itaconic anhydride groups; alicyclic groups such as adamantyl, norbornyl, cyclohexyl, etc.; carbocyclic aryl groups such as naphthyl, phenol; etc.

Preferably, the combined resin or oligomer components of an antireflective hard mask composition of the invention will have one or more inorganic, etch resistant elements present in an amount of at least about 3, 4, 5, 6, 7 or 8 mole percent of the total molar amount of resins or oligomers of the composition. Even higher content of inorganic, etch-resistant atoms may be employed, e.g. a concentration of inorganic, etch resistant elements of at least about 10, 12, 15, or 20 mole percent based on the total amount of resins or oligomers of the compositions. As discussed herein, typical components of an antireflective hard mask composition of the invention are the resin or oligomer components that contain the antireflective chromophore and inorganic, etch-resistant element; if a crosslinking composition, a crosslinker, typically with an acid source; and a solvent carrier. The compositions may however comprise additional components. For instance, the antireflective chromophore and inorganic, etch-resistant element may be provided by non-polymeric, small molecule (e.g. molecular weight less than about 500) additives.

Molecular weights of resins of antireflective hard mask compositions of the invention can vary relatively widely, e.g. weight average molecular weight (Mw) of about 1,000 to about 1,000,000 daltons.

The concentration of the antireflective chromophore and inorganic, etch-resistant component(s) of compositions of the invention may vary within relatively broad ranges, and in general those component(s) are employed in a concentration of from about 50 to 95 weight percent of the total of the dry components of the composition, more typically from about 60 to 90 weight percent of the total dry components (all components except solvent carrier).

Crosslinking-type antireflective hard mask compositions of the invention also contain a crosslinker component or material. A variety of crosslinkers may be employed, including those ARC crosslinkers disclosed in the above-mentioned Shipley U.S. Pat. No. 5,851,730, such as glycouril crosslinkers, particularly methoxy methylated glycouril commercially available under the tradename of Powderlink 1174 from the American Cyanamid Co. Other amine-based crosslinkers may be suitable. For example, melamine crosslinkers may be suitable, particularly melamine-formaldehye resins such as those sold under the tradename Cymel by American Cyanamid such as Cymel 300, 301, 303, 350. Benzoguanamine-based resins and urea-based resins also may be suitable such as the urea resins sold as Bettle 60, 65 and 80 by American Cyanamid, and the benzoguanamine resins sold under the trade names of Cymel 1123 and 1125 by American Cyanamid.

Crosslinking antireflective hard mask compositions of the invention preferably further comprise an acid or acid generator compound for catalyzing or promoting reaction of the crosslinker during curing of the antireflective hard mask coating layer. Preferably an acid generator compound is employed that liberates acid upon photolysis or thermal treatment. Preferably the acid generator is a thermal acid generator is employed, i.e. a compound that generates acid upon thermal treatment. A variety of known thermal acid generators are suitably employed such as e.g. benzoin tosylate, nitrobenzyl tosylate particularly 4-nitrobenzyl tosylate, and other alkyl esters of organic sulfonic acids. A preferred thermal acid generator is Nacure 5225 available from King Industries. Compounds that generate a sulfonic acid upon activation are generally suitable. Typically a thermal acid generator is present in a crosslinking antireflective hard mask composition in concentration of from about 0.3 to 3 percent by weight of the total of the dry components of the composition. Instead of or in addition to a thermal acid generator, a photoacid generator may be employed as an acid generator, and the antireflective hard mask coating layer blanket exposed to activating radiation prior to application of an overcoated photoresist composition.

Also, rather than an acid generator, an acid may be simply formulated into a crosslinking antireflective hard mask composition of the invention, particularly for antireflective hard mask compositions that require heating to cure in the presence of acid so that the acid does not promote undesired reaction of composition components prior to use of the composition. Suitable acids include e.g. sulfonic acids such as toluene sulfonic acid and sulfonic acid, triflic acid, or mixtures of those materials.

The present invention also includes antireflective hard mask compositions that do not undergo significant crosslinking during intended use with a photoresist composition. Such non-crosslinking compositions need not include a crosslinker component or an acid or thermal acid generator for inducing or promoting a crosslinking reaction. In other words, such non-crosslinking antireflective hard mask compositions typically will be essentially free (i.e. less than about 1 or 2 weight percent) or completely free of a crosslinker component and/or acid source for promoting a crosslinking reaction.

Referring again to Step 2 of FIG. 1, if the antireflective hard mask composition is a crosslinking-type composition, the composition is preferably at least partially cured at this step, prior to application of a photoresist layer. Thermal treatment is generally preferred. Cure or crosslinking conditions will vary with the components of the antireflective hard mask composition. Suitable conditions may include e.g. heating the coated substrate 10 at about 200° C. for about 10 to 30 minutes.

Antireflective compositions of the invention preferably also comprise one or more photoacid generators (i.e. "PAG") that are suitably employed in an amount sufficient to inhibit or substantially prevent undesired notching or footing of an overcoated photoresist layer. In this aspect of the invention, the photoacid generator is not used as an acid source for promoting a crosslinking reaction, and thus preferably the photoacid generator is not substantially activated during crosslinking of the antireflective composition (in the case of a crosslinking antireflective hard mask). In particular, with respect to antireflective hard mask compositions that are thermally crosslinked, the antireflective hard mask composition PAG should be substantially stable to the conditions of the crosslinking reaction so that the PAG can be activated and generate acid during subsequent exposure of an overcoated resist layer. Specifically, preferred PAGs do not substantially decompose or otherwise degrade upon exposure of temperatures of from about 140° C. or 150° C. to 190° C. for 5 to 30 or more minutes. Such PAGs and the use thereof in antireflective coating composition are disclosed in U.S. patent application Ser. No. 08/797,741, filed Feb. 6, 1997 of Pavelchek et al and corresponding Japanese Patent Application no. 10-61845, both assigned to the Shipley Company. Suitable PAGs for use in the antireflective hard mask compositions of the invention are identified in the below discussion of photoresist PAGs. Generally preferred photoacid generators for such use in ARCs of the invention include e.g. onium salts such as di(4-tert-butylphenyl)iodonium perfluoroctane sulphonate, and halogenated non-ionic photoacid generators such as 1,1-bis[p-chlorophenyl]-2,2,2-trichloroethane.

Antireflective hard mask compositions of the invention also may contain additional dye compounds that absorb radiation used to expose an overcoated photoresist layer. Other optional additives include surface leveling agents, for example, the leveling agent available under the tradename Silwet 7604 from Union Carbide, or the surfactant FC 430 available from the 3M Company. Preferred surfactant is concentration between 0.2 to 1.5% of solids.

To make a liquid coating antireflective hard mask composition suitable for spin-on applications, the composition components are dissolved in a suitable solvent such as, for example, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of an antireflective hard mask composition varies from about 0.5 to 20 weight percent of the total weight of the antireflective hard mask composition, preferably the solids content varies from about 2 to 10 weight percent of the total weight of the composition.

Referring now to Step 3 of FIG. 1, a photoresist coating layer 16 is applied over the antireflective hard mask layer 14. As with application of layer 14, the resist can be applied by any standard means such as spinning.

A variety of photoresist compositions can be employed with the antireflective hard mask compositions of the invention, including positive-acting and negative-acting photoacid-generating compositions. Photoresists for use with ARCs of the invention in general contain a resin binder and a photoactive component, typically a photoacid generator compound. Preferably the photoresist resin binder has functional groups that impart alkaline aqueous developability to the imaged resist composition. Generally particularly preferred photoresists for use with antireflective compositions of the invention are positive-acting and negative-acting chemically-amplified resists. A number of chemically-amplified resist compositions have been described, e.g., in U.S. Pat. Nos. 4,968,581; 4,883,740; 4,810,613; 4,491,628 and 5,492,793, all of which are incorporated herein by reference for their teaching of making and using chemically amplified positive-acting resists. A particularly preferred chemically amplified photoresist for use with an antireflective composition of the invention comprises in admixture a photoacid generator and a resin binder that comprises a copolymer containing both phenolic and non-phenolic units. For example, one preferred group of such copolymers has acid labile groups substantially, essentially or completely only on non-phenolic units of the copolymer. One especially preferred copolymer binder has repeating units x and y of the following formula:

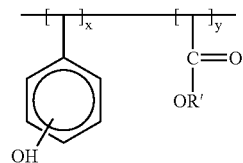

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a Mw of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornyl or vinyl cyclohexanol compound, also may be used as a resin binder in compositions of the invention. Such copolymers also may be prepared by such free radical polymerization or other known procedures and suitably will have a Mw of from about 8,000 to about 50,000, and a molecular weight distribution of about 3 or less. Additional preferred chemically-amplified positive resists are disclosed in U.S. Pat. No. 5,258,257 to Sinta et al.; U.S. Pat. No. 5,700,624 to Thackeray et al.; and U.S. Pat. No. 5,861,231 to Barclay et al.

Preferred negative-acting resist compositions for use with an antireflective composition of the invention comprise a mixture of materials that will cure, crosslink or harden upon exposure to acid, and a photoacid generator. Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycourils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycouril resins are sold by American Cyanamid under trade names Cymel 1170, 1171, 1172, Powderlink 1174, urea-based resins are sold under the trade names of Beetle 60, 65 and 80, and benzoguanamine resins are sold under the trade names Cymel 1123 and 1125.

Suitable photoacid generator compounds of resists used with antireflective hard mask compositions of the invention include the onium salts, such as those disclosed in U.S. Pat. Nos. 4,442,197, 4,603,101, and 4,624,912, each incorporated herein by reference; and non-ionic organic photoactive compounds such as the halogenated photoactive compounds as in U.S. Pat. No. 5,128,232 to Thackeray et al. and sulfonate photoacid generators including sulfonated esters and sulfonyloxy ketones. See *J. of Photopolymer Science and Technology*, 4(3):337-340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al. The camphorsulfonate PAGs of formulae I and II at column 6 of U.S. Pat. No. 5,879,856 are also preferred photoacid generators for resist compositions used with the antireflective compositions of the invention, particularly chemically-amplified resists of the invention.

In Step 3 of FIG. 1, after application of resist layer 16 as discussed above, the photoresist coating layer is typically dried by heating to remove solvent preferably until the resist layer is tack free. Optimally, essentially no intermixing of the ARC layer and photoresist layer should occur.

The resist layer is then imaged with activating radiation through a mask in conventional manner. The exposure energy is sufficient to effectively activate the photoactive component of the resist system to produce a patterned image in the resist coating layer, more specifically, the exposure energy typically ranges from about 3 to 300 $mJ/cm^2$ depending upon the exposure tool. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to 160° C. Resists can be imaged with a wide range of exposure energy, e.g. I-line radiation (365 nm), deep UV particularly 248 nm, sub-200 nm wavelengths such as 193 nm and 157 nm, e-beam, EUV, ion projection lithography (IPL) and extremely short wavelength exposure such as X-ray and other sub-20 nm imaging.

After the latent image is formed in the resist layer, in Step 4 of FIG. 1 the resist is developed (i.e. exposed areas removed in the case of a positive resist, unexposed areas removed in the case of a negative resist). Wet development will be suitable, e.g. with an aqueous tetrabutylammonium hydroxide solution, or other aqueous alkaline solution to provide resist relief images 16' over antireflective hard mask layer 14 as shown in Step 4 of FIG. 1. The photoresist layer also may be dry developed with a plasma (e.g. oxygen-based plasma) if desired.

In Step 5, antireflective hard mask layer 14 is patterned with a plasma distinct from the plasma employed to form the overlying resist relief images 16'. For instance, antireflective hard mask layer can be etched with a halide-based plasma such as a fluorine or chlorine-based plasma to provide antireflective hard mask relief images 14' that correspond to the overlying resist relief images 16' as shown in Step 5 of FIG. 1. A preferred material, particularly to etch an antireflective hard mask layer containing Si, is a plasma formed in a gas flow of $CF_3$, preferably in the substantial (less than 3 or 5 molar %) absence of oxygen. A chlorine-based plasma etchant is particularly to etch an antireflective hard mask layer containing Al.

Thereafter, as shown in Step 6 of FIG. 1, the underlying dielectric layer 12 can be etched e.g. by an oxygen-based plasma which removes resist relief images 16' and dielectric layer 12 not masked by patterned antireflective hard mask layer 14', which is resistant to the oxygen-based plasma because of the inorganic component of that layer as discussed above.

The selectively defined surface of substrate 10 can then be processed as desired, e.g. the defined areas can be metallized such as by vapor deposited copper, aluminum, tungsten, or other conductive metal, or alloys thereof to provide circuit traces or electrical interconnect vias 19 as depicted in Step 7 of FIG. 1. A preferred metal to form vias or traces 19 is CVD copper, or electroplated copper.

All documents mentioned herein are incorporated herein by reference. The following non-limiting examples are illustrative of the invention.

EXAMPLE 1

Synthesis of Organosilicon Polymer of the Invention 15.00 grams of 9-anthracenemethyl methacrylate, 5.61 grams of 2-hydroxyethyl methacrylate, and 26.33 grams of 3[tris(trimethylsilyloxy)silyl]propyl methacrylate were dissolved in 320 grams of tetrahydrofuran. The solution was degassed with a stream of dry nitrogen for 10 minutes and heated to 45° C. 0.475 grams of the polymerization initiator 2,2'azobisisobutyrnitrile was then added to the solution and the solution heated at reflux for 24 hours. The polymer product was isolated by precipitation into 12 L of deionized water and dried in vacuum. Yield 84%. Weight average molecular weight (vs. polystyrene standards) 22,000.

EXAMPLE 2

Preparation and Use of a Composition of the Invention

An ARC/hard mask composition of the invention is prepared by admixing the following components: organosilicon polymer of Example 1 above (10 grams), Powderlink 1174 glycouril crosslinker (1.5 grams), para-toluenesulfonic acid (0.2 grams) in a solvent of ethyl lactate to provide a formulation at about 4 weight percent total solids.

That ARC/hard mask composition is spin coated onto a cured dielectric layer (epoxy layer) and dried to provide a coating layer thickness of about 100 nm. A commercially available positive photoresist is then spin coated over the ARC layer to a thickness of about 300 nm and the resist layer exposed to patterned radiation at 248 nm wavelength and developed with an aqueous alkaline developer to provide a resist relief image. The ARC/hard mask layer is then patterned with a fluorine plasma and thereafter the underlying dielectric layer is etched with an oxygen, fluorine free plasma.

The foregoing description of the invention is merely illustrative thereof, and it is understood that variations and modifications can be effected without departing from the scope or spirit of the invention as set forth in the following claims.

What is claimed is:

1. A method for forming a photoresist relief image
   (a) applying over an integrated circuit substrate a coating layer of an antireflective composition that comprises at least two resins,
   the at least two resins comprising i) a silsesquioxane resin and ii) an organic resin that comprises one or more phenyl groups; and
   (b) applying a coating layer of a photoresist composition over the antireflective composition layer; and
   (c) exposing the photoresist composition to patterned radiation having a wavelength of below 200 nm and developing the exposed photoresist composition layer to form a photoresist relief image.

2. The method of claim 1 wherein the photoresist is exposed to radiation having wavelength of about 193 nm.

3. The method of claim 1 wherein the antireflective composition further comprises an acid or acid generator compound.

4. The method of claim 1 wherein the antireflective composition further comprises an amine-based crosslinker.

5. The method of claim 4 wherein the crosslinker is a glycouril.

6. The method of claim 1 wherein the antireflective composition is crosslinked.

7. The method of claim 1 wherein a dielectric layer underlies the antireflective composition layer.

8. The method of claim 7 wherein the dielectric layer comprises $SiO_2$.

9. The method of claim 7 wherein the dielectric layer comprises an organic resin.

10. The method of claim 1 wherein the photoresist comprises a non-phenolic resin.

* * * * *